United States Patent

Dobler et al.

Patent Number: 6,016,104
Date of Patent: Jan. 18, 2000

[54] SYSTEM FOR CONTROLLING THE RESISTANCE OF A LOAD CONNECTED TO A TRANSFORMER

[75] Inventors: Klaus Dobler, Gerlingen; Erich Zabler, Stutensee; Anton Dukart, Worth; Thomas Herrmann, Langenbrettach, all of Germany

[73] Assignee: Robert Bosch GmbH, Stuttgart, Germany

[21] Appl. No.: 09/029,092

[22] PCT Filed: Apr. 27, 1996

[86] PCT No.: PCT/DE96/00739

§ 371 Date: Feb. 18, 1998

§ 102(e) Date: Feb. 18, 1998

[87] PCT Pub. No.: WO97/06980

PCT Pub. Date: Feb. 27, 1997

[30] Foreign Application Priority Data

Aug. 19, 1995 [DE] Germany .................. 195 30 588

[51] Int. Cl.$^7$ .................................................. G08B 21/00
[52] U.S. Cl. ..................... 340/646; 340/635; 340/438; 307/10.1; 180/271
[58] Field of Search ........................ 340/646, 635, 340/438; 307/10.1; 180/271; 280/735, 734

[56] References Cited

U.S. PATENT DOCUMENTS

| | | | |
|---|---|---|---|
| 4,893,109 | 1/1990 | Vrabel et al. | 340/438 |
| 4,956,631 | 9/1990 | Itoh | 340/436 |
| 5,041,817 | 8/1991 | Reeb | 340/635 |
| 5,122,780 | 6/1992 | Midorikawa et al. | 340/438 |
| 5,268,643 | 12/1993 | Aso et al. | 324/502 |
| 5,461,358 | 10/1995 | Ravas, Jr. et al. | 340/438 |
| 5,515,027 | 5/1996 | Billing et al. | 340/438 |
| 5,541,523 | 7/1996 | Tourville et al. | 340/438 X |
| 5,621,326 | 4/1997 | Watanabe et al. | 324/502 |
| 5,659,474 | 8/1997 | Maeno et al. | 307/10.1 X |

*Primary Examiner*—Jeffery A. Hofsass
*Assistant Examiner*—Sihong Huang
*Attorney, Agent, or Firm*—Kenyon & Kenyon

[57] ABSTRACT

An arrangement allowing a definite and reliable determination of a load resistance connected to the secondary side of a transformer includes devices, which measure exclusively the inductance of the transformer on the primary side and signal a load malfunction in the case of deviation from a predefined value.

7 Claims, 2 Drawing Sheets

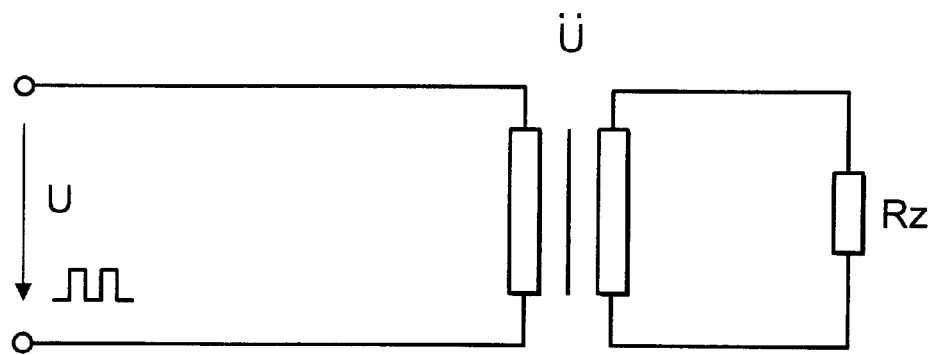
F I G. 1
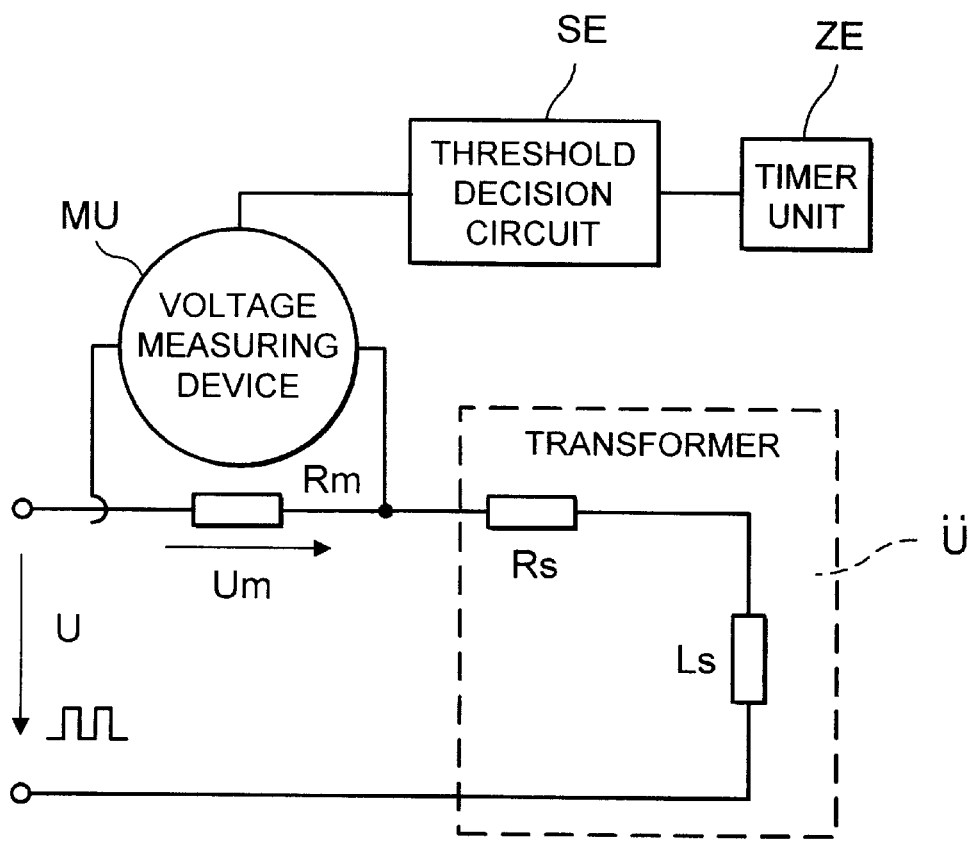
F I G. 2

SYSTEM FOR CONTROLLING THE RESISTANCE OF A LOAD CONNECTED TO A TRANSFORMER

FIELD OF THE INVENTION

The present invention relates to an arrangement for monitoring the resistance of a load connected to the secondary coil of a transformer. In particular, the present invention relates to monitoring the resistance of an airbag squib (firing pellet).

BACKGROUND INFORMATION

A conventional arrangement is described in German Patent 38 12 633 A1 in which a rotary transformer is used, for example, for transmitting signals between a controller and an airbag installed in the steering wheel of a vehicle. The operability of an airbag must be constantly monitored to ensure that it is ready for use in any emergency situation, so the resistance of the squib, which should typically be between 1.8 Ohm to 2.5 Ohm, is subjected to periodic measurement. In the conventional arrangement, the signal transmission between the controller and the airbag using inductively coupled coils of the rotary transformer depends on the distance between the two coils, i.e., the size of the air gap between the pot-type cores of the coils. Consequently, assembly and manufacturing tolerances of the steering wheel, in which the secondary pot-type core of the rotary transformer is installed, may result in distortions of the measured resistance of the squib. In order to avoid such distortions, the aforementioned background art provides an oscillator circuit on the secondary side of the rotary transformer, which is excited by a control signal from the primary side. After the control signal is turned off, the decay of the response signal of the oscillator circuit is retransmitted to the primary side and the resistance on the secondary side is calculated from the decaying response signal.

SUMMARY OF THE INVENTION

According to the present invention, the resistance of a load preferably an airbag squib connected to the secondary coil of a transformer is monitored for deviation from a given value by measuring exclusively the inductance of the transformer on the primary side. This procedure relies on the fact that the inductance measured on the primary side only depends on the resistance of the load connected on the secondary side. Therefore, if the measured inductance is found to deviate from a certain value, it can be deduced that the load resistance has changed. A shift in inductance may also be used to generate a signal indicating an undesired change in the load.

Useful embodiments of the invention are presented in the subclaims. In one embodiment, a measuring resistor that is much greater than the primary side input resistance of the transformer is installed in the primary circuit of the transformer. The primary side of the transformer is supplied with a pulsed control voltage, and the rise and/or decay time constant of a voltage drop across the measuring resistance is determined. Due to the considerable discrepancy in size between the resistance of the measuring resistor and the load resistance, the time constant is almost exclusively dependent on the primary side inductance of the transformer, thus establishing a direct relationship with the load resistance. Additionally, the transformer input resistance, which has no such direct dependence on the load resistance, has no effect on the measured time constant. Therefore, the time constant provides definite and reliable unambiguous information on whether the load resistance has changed due to a malfunction. It is preferable to select the pulse frequency of the pulsed control voltage so that the inductance of the transformer measured on the primary side has as little dependence as possible on the change in the coupling between the primary and secondary coils of the transformer when the load resistance operates properly.

BRIEF DESCRIPTION OF THE DRAWINGS

FIG. 1 shows a transformer with a load connected thereto.

FIG. 2 shows an equivalent circuit of a transformer on the primary side with devices connected thereto for determining the inductance of the transformer.

DETAILED DESCRIPTION

FIG. 1 shows schematic diagram of a transformer Ü and a load resistance Rz connected to its secondary side. Transformer Ü may be a rotary transformer, for example, arranged between a steering wheel equipped with an airbag and a rigid steering column. Load Rz connected to the secondary side would then represent the resistance of an airbag squib. Such a squib normally has a resistance Rz of approximately 2 Ohm. If the resistance of the squib changes beyond a certain limit value, this indicates that the function of the airbag has been impaired and this must be signaled in the vehicle. Preferably, monitoring of the squib resistance Rz should be performed periodically on a regular basis.

Viewed from the primary side, transformer Ü has the equivalent circuit framed with a dashed line in FIG. 2, consisting of a resistor Rs and an inductance Ls. A measuring resistor Rm is connected in series with resistor Rs. A voltage measuring device Mu measures the voltage drop Um across measuring resistor Rm. A pulsed control voltage U is applied on the primary side input of transformer Ü.

Figure 3:
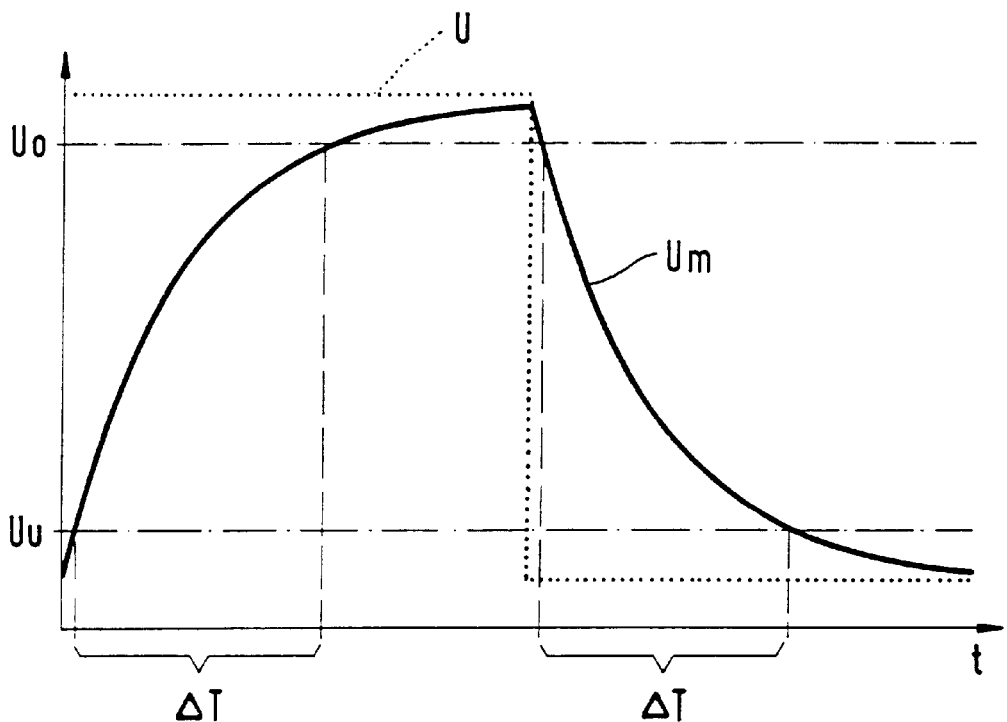
FIG. 3 shows the voltage variation measured on the primary side of the transformer.

FIG. 3 shows the variation of measuring voltage Um as a response to a pulse of control voltage U. Both the rise and the decay of measuring voltage Um take place with a time constant τ. This time constant τ depends on inductance Ls and resistances Rs and Rm according to the following equation:

$$\tau = \frac{Ls}{Rs + Rm} \qquad (1)$$

It can be seen that the rise and decay time constant τ depends on both inductance Ls and resistance Rs of the transformer. The inductance Ls and resistance Rs of the transformer depend on a load resistance Rz connected to the secondary side. The dependence of resistance Rs the load resistance Rz is, however, not definitive. Therefore, the measuring resistance Rm is selected so that the effect of resistance Rs on time constant τ virtually disappears; for example, selecting an Rm with a resistance that is at least 10 times as great as the resistance of Rs. The rise and decay time constant τ of measuring voltage Um is then almost exclusively dependent on the inductance Ls of the transformer, as follows:

$$\tau = \frac{Ls}{Rm} \quad (2)$$

$$\tau = \frac{Ls}{Rm}$$

The variation of the measuring voltage Um in the rising branch can be described with:

$$Um(t) = Rm \cdot I \cdot \left(1 - e^{-t\left(\frac{1}{\tau}\right)}\right) \quad (3)$$

The variation of the measuring voltage Um in the decaying branch can be described with:

$$Um(t) = Rm \cdot I \cdot e^{-t\left(\frac{1}{\tau}\right)} \quad (4)$$

By first supplying the rise and decay time constant τ can be determined as follows. The measuring voltage Um to a threshold decision circuit SE (see FIG. 2). As shown in FIG. 3, this threshold decision circuit has a lower threshold Uu and an upper threshold Uo for measuring voltage Um. As soon as the measuring voltage Um exceeds lower threshold Uu, a counter in a timer unit ZE is started. When the measuring voltage reaches the upper threshold Uo, the counter is stopped. The counter status is then proportional to the rise time constant τ. If the time constant τ is determined while the measuring voltage is decaying, the time between dropping below the upper threshold Uo and reaching the lower threshold Uu is determined. The upper and lower voltage thresholds can be described as follows:

$$Uo = U\left(1 - e^{-\Delta T\left(\frac{1}{\tau}\right)}\right) \quad (5)$$

$$Uu = U \cdot e^{-\Delta T\left(\frac{1}{\tau}\right)} \quad (6)$$

where ΔT is the time of transit, measured by timer unit Ze, of the measuring voltage between the two voltage thresholds Uu and Uo (see FIG. 3). From equation (5), the following expression derived for the time constant:

$$\tau = \frac{-\Delta T}{\ln\left(\frac{Uo + U}{U}\right)} \quad (7)$$

And the following expression for the time constant is derived from equation (6):

$$\tau = \frac{-\Delta T}{\ln\left(\frac{Uu}{U}\right)} \quad (8)$$

In order to improve the accuracy in determining the time constant τ, it is recommended that the time constant τ be determined according to the procedure described above for a plurality of pulses of control voltage U, and the results averaged. According to equation (2), the inductance Ls of the transformer is then:

$$Ls = \tau \cdot Rm \quad (9)$$

Figure 4:
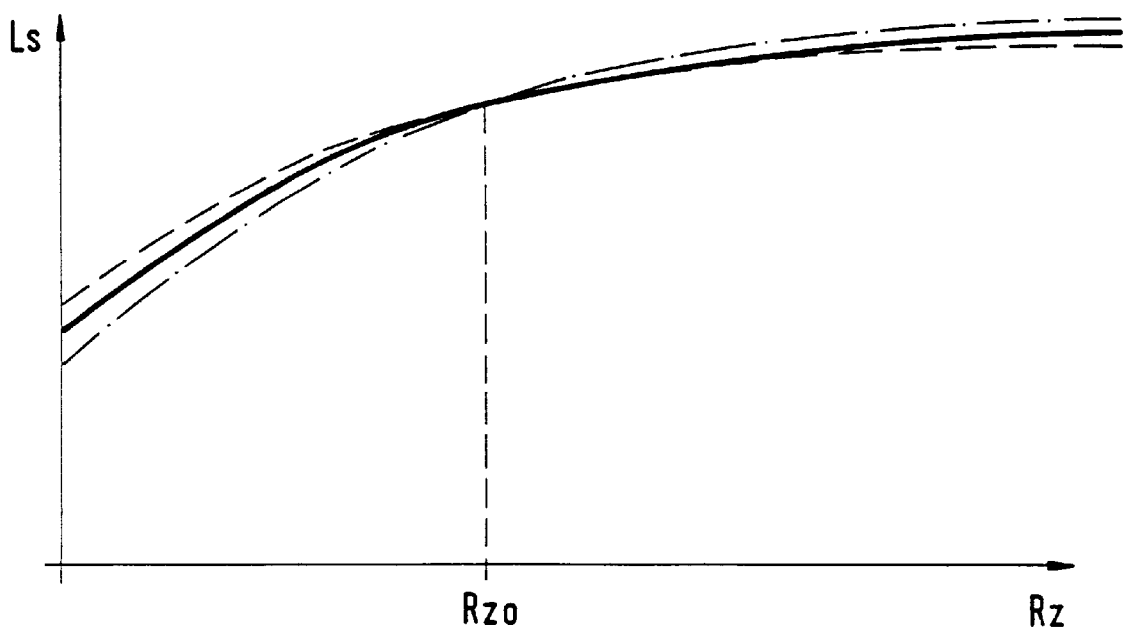
FIG. 4 shows the inductance of the transformer plotted against the resistance of a load connected to the secondary side.

FIG. 4 shows inductance Ls measured on the primary side plotted against load resistance Rz connected to the secondary side of the transformer, showing a direct relationship between Ls and Rz. The two curves above and below the curve drawn in a solid line for inductance Ls are obtained for an axial shift between the primary and secondary coils of transformer Ü. The curve drawn in a dashed line results when there is a greater distance between the two coils, and the dot-dashed line results when the two coils approach one another. It is to be noted that all curves intersect in a single point. The position of the point of intersection depends on the pulse frequency of control voltage U. If the pulse frequency of control voltage U is increased, this point of intersection shifts toward a higher load resistance Rz. The pulse frequency of control voltage U should be selected so that the point of intersection of the curves is in the range of a load resistance Rz0 of a properly operating load. The measured inductance Ls will then have a constant value that is independent of the axial displacement of the transformer coils when the load operates properly. Thus, a malfunction will be detected only when an inductance Ls that is different from this constant value is measured. Since inductance Ls is also kept constant as long as the properly operating load has a resistance Rz0, a load malfunction cannot be detected from an axial displacement of the transformer coils.

We claim:

1. An arrangement for monitoring a resistance of a load to monitor an operability of an airbag, the load being connected to a secondary side of a transformer, comprising:
    a measuring device for measuring exclusively an inductance of the transformer on a primary side of the transformer; and
    a signaling device for signaling a load malfunction if the measured inductance deviates from a predetermined value.

2. The arrangement according to claim 1, wherein the load includes a squib of the airbag.

3. The arrangement according to claim 1, wherein the transformer includes a primary coil and a secondary coil, and wherein one of the primary and secondary coils is rotated in relation to the other of the primary and secondary coils.

4. The arrangement according to claim 1, wherein the measuring device includes:
    a supply device delivering a pulsed control voltage to the primary side of the transformer;
    a measuring resistance arranged in a primary circuit of the transformer, wherein the measuring resistance is at least ten times larger than a primary side input resistance of the transformer, and wherein the measuring resistance has a measuring voltage drop with a rise time constant and a decay time constant as a result of the pulsed control voltage; and
    a plurality of circuit devices determining at least one of the rise time constant and the decay time constant.

5. The arrangement according to claim 4, wherein the plurality of circuit devices include:
    a threshold decision circuit having a predetermined lower threshold voltage and a predetermined upper threshold voltage; and
    a timer unit,
    wherein the plurality of circuit devices receive the measuring voltage drop across the measuring resistance, wherein the timer unit measures a period of time in which the measuring voltage drop goes from one of the predetermined lower threshold voltage and the predetermined upper threshold voltage to the other of the predetermined lower threshold voltage and the predetermined upper threshold voltage, and wherein at least one of the rise time constant and the decay time constant is derived from the measured period of time.

6. The arrangement according to claim 4, wherein a plurality of pulsed control voltages are supplied by the supply device, and wherein the plurality of circuit devices derive at least one of an average rise time constant and an average decay time constant.

7. The arrangement according to claim 4, wherein a pulse frequency of the pulsed control voltage is selected so that a first effect on the inductance of the transformer due to a change in a coupling between primary and secondary coils of the transformer is smaller than a second effect on the inductance due to the resistance of the load when operating properly.

* * * * *